(12) United States Patent
De Geest et al.

(10) Patent No.: US 9,084,353 B2
(45) Date of Patent: Jul. 14, 2015

(54) STRUCTURED CIRCUIT BOARD AND METHOD

(75) Inventors: Jan De Geest, Wetteren (BE); Stefaan Hendrik Jozef Sercu, Wuustwezel (BE)

(73) Assignee: FCI, Guyancourt (FR)

( * ) Notice: Subject to any disclaimer, the term of this patent is extended or adjusted under 35 U.S.C. 154(b) by 184 days.

(21) Appl. No.: 13/807,325

(22) PCT Filed: Jun. 28, 2011

(86) PCT No.: PCT/EP2011/060785
§ 371 (c)(1),
(2), (4) Date: Mar. 6, 2013

(87) PCT Pub. No.: WO2012/000974
PCT Pub. Date: Jan. 5, 2012

(65) Prior Publication Data
US 2013/0199834 A1    Aug. 8, 2013

(30) Foreign Application Priority Data

Jun. 29, 2010   (WO) .................. PCT/IB2010/002960

(51) Int. Cl.
*H05K 1/02*   (2006.01)
*H05K 1/11*   (2006.01)

(52) U.S. Cl.
CPC .............. *H05K 1/0251* (2013.01); *H05K 1/115* (2013.01); *H05K 1/024* (2013.01)

(58) Field of Classification Search
CPC .................................................... H05K 1/0251
USPC .................................................. 174/262–266
See application file for complete search history.

(56) References Cited

U.S. PATENT DOCUMENTS

| 2002/0027020 A1 | 3/2002 | Kobayashi et al. |
| 2006/0255876 A1 | 11/2006 | Kushta et al. |
| 2009/0056999 A1 | 3/2009 | Kashiwakura |
| 2009/0201658 A1 | 8/2009 | Lemke et al. |

OTHER PUBLICATIONS

International Patent Application No. PCT/EP2011/060785: International Search Report dated Oct. 6, 2011, 11 pages.

*Primary Examiner* — Jeremy C Norris
(74) *Attorney, Agent, or Firm* — Baker & Hostetler LLP (57) ABSTRACT

A circuit board (1) is provided comprising a plurality of insulating layers, at least one ground layer and at least one layer comprising signal traces. The circuit board comprises at least a first conductive via (17) and a second conductive via (17). The first conductive via and the second conductive via penetrate through at least a first insulating layer of the plurality of insulating layers and are connected to a signal trace. The first conductive via and the second conductive via are arranged adjacent each other. At least in the first insulating layer the first conductive via and the second conductive via are separated in a first direction of separation (R) by a first adjustment portion comprising a dielectric material property different from the first insulating layer.

21 Claims, 12 Drawing Sheets

STRUCTURED CIRCUIT BOARD AND METHOD

CROSS REFERENCE TO RELATED APPLICATIONS

This application is a national stage entry of International Patent Application No. PCT/EP2011/060785 filed on Jun. 28, 2011, which claims priority to International Patent Application No. PCT/IB2010/002960 filed on Jun. 29, 2010, all of which are hereby incorporated by reference.

TECHNICAL FIELD

The present disclosure relates to the field of electric circuit boards, in particular to multi-layered electric circuit boards and to connectors comprising the same.

BACKGROUND

It is generally known that signals, in particular high frequency signals, which are transmitted through transmission lines may suffer from insertion losses. The magnitude of the insertion loss depends on the signal frequency, the transmission line geometry and the material properties. The magnitude of the insertion loss is generally indicated in units of dB loss, 0 dB meaning no loss, −6 dB meaning a loss of a factor two compared to the incident value and −20 dB indicating a loss of a factor ten. A signal transmitted through a transmission line having a first portion with one geometry bordering a second portion with another geometry may suffer significant losses at the border between the first and second portions.

It is further generally known that transmission lines arranged close to each other may exhibit signal cross talk. Also this effect is dependent on the signal frequency and on the geometries and the material properties of the transmission lines concerned.

Obviously both insertion loss and cross talk are undesirable and much research effort is spent designing transmission lines and/or interconnection devices, such as connectors, wherein these effects are reduced or prevented for one or more particular frequencies, preferably over wide frequency ranges.

The most effective methods found to date include widely separating the affected conductors and/or providing additional components for shielding and/or grounding in-between them. However, these solutions counteract the ongoing strive for smaller, less costly devices which preferably also are suited for transmitting a plurality of signals at various high frequencies.

US 2002/0027020 discloses a through-hole structure for connecting a connector to a printed circuit board, the through-hole structure comprising a signal through-hole having a conductive layer therein for supplying a signal to the printed circuit board, power through-holes having a conductive layer therein for supplying power to the printed circuit board, and dielectric constant adjusting portions formed among the signal through-hole and the power through-holes. The through-hole structure is provided to reduce interference and noise in a connector portion of a printed circuit board connected to a high frequency connector, in which the signal through-hole is surrounded by the power through-holes.

US 2006/0255876 discloses a compact via transmission line for a printed circuit board having preferred characteristic impedance and capable of miniaturizing the printed circuit board including a multilayer printed circuit board, and extending the frequency range of a via transmission line mounted on the printed circuit board, and a design method of the same. The transmission line has a central conductor forming an inner conductor layer boundary make up a signal via hole, a plurality of via holes arranged around the central conductor form an outer conductor layer boundary, and a plurality of conductor plates formed of a printed circuit board conductor layer, is further provided with a constitutive parameter adjustment clearance hole between the inner and outer conductor layer boundaries of the compact via transmission line, and electrically isolates to prevent cross-talk of a signal propagating through a signal via hole with other signals in a high-frequency signal band. The disclosed via transmission lines are of the coaxial type, with each signal via hole being surrounded by a shield of ground via holes.

It is an object of the present disclosure to provide improved interconnection devices for high frequency signals, preferably at low voltages (below 5V), which are compatible with increased demands for miniaturisation, low noise levels and manufacturing cost-effectiveness.

SUMMARY

In a first aspect, a circuit board according to claim 1 is provided. The first and second conductive vias facilitate connection, e.g. of connector contacts, to the signal traces. The first adjustment portion allows adjustment of the impedance of the first and/or second conductive vias to an appropriate value by providing the adjustment portion with one or more appropriately selected dielectric material properties. In this way, signals traveling through conductive vias separated in such way exhibit less interaction than in the absence of the first adjustment portion. Further and/or alternatively, the first adjustment portion allows reducing the separation between the conductive vias, and thus an object size, while any interaction between signals transmitted through the conductive vias may be maintained below a predetermined level.

The dielectric material property affected by the adjustment portion may be at least one of the relative dielectric constant, the relative permittivity and the absorption of the material.

The first insulating layer may comprise portions with dielectric material properties at different locations. The adjustment portion is configured to provide a local variation of the dielectric material properties compared to the insulating layer material surrounding the first and second conductive vias and/or the adjustment portion so as to adjust the interaction and/or impedance to an appropriate value. The adjustment portion may comprise or form a local disruption (in the material) of the first insulating layer.

In a desirable circuit board, the first conductive via and second conductive via are configured as a differential signal pair for differential signaling. Differential signaling allows transmission of signals with increased integrity and reliability at increased frequencies and with reduced power compared to single-ended transmission. Geometrical and the environment (electrical length) differences along one conductor of a differential signal pair with respect to the other conductor of the pair may lead to signal skew and noise; this should be avoided. Impedance mismatch along a differential signal pair may lead to reflections and insertion losses; this should be avoided too. The circuit board according to claim 2 allows providing a desired improved impedance adaptation and— matching to further portions of a differential signal pair transmission line.

The circuit board of claim 3 provides shielding of at least the first conductive via, improving signal quality. Impedance mismatch between the first (and/or second) conductive via and connected circuitry due to the third conductive via may be reduced and/or prevented by the second adjustment portion.

The circuit boards of claims 4 and 5 provide an improved strip-line configuration which is beneficial for signal transmission, in particular at high signal frequencies. A strip line geometry allows reducing device size and facilitates layered construction. It has surprisingly been found by the applicant that significant improvements may be achieved in different frequency ranges by providing just the first adjustment portion or all of the first, second and third adjustment portions.

The circuit board of claim 6 provides an improved stripline geometry accommodating a plurality of signals. In particular when the first and second via and the fifth and sixth via are configured as two differential signal pairs, reduced insertion loss is achievable. In particular when adjustment portions are provided in at least the first insulating layer, significantly reduced cross talk between the pairs is achievable.

The circuit board of claim 7 is particularly suited for high frequency signals, in particular with frequencies of approximately 10 GHz and higher.

The circuit board of claim 8 provides a particular improvement since air has a minimum relative dielectric constant and relative permittivity and thus facilitates providing a large difference with the material of the insulating layer and associated improvement of the circuit board. Such circuit board also reduces manufacturing costs compared to manufacturing a circuit board with adjustment portions of different materials. Air gaps further allow reducing separation between charged conductors without risking short-circuiting. An adjustment portion may comprise a plurality of air gaps.

The circuit boards of claims 9 and/or 10 provide improvements by one or more appropriately formed adjustment portions, where applicable advantageously all adjustment portions. Larger adjustment portions generally result in further improved transmission; in particular for adjacent differential signal pairs, larger adjustment portions with lower dielectric constant, e.g. air gaps with a size of approximately a diameter of the separated conductive vias, provide improved cross talk separation. The size of the adjustment portion(s) in one or both directions specified in these claims is preferably chosen to provide a desired impedance corresponding to an impedance of an adjoining portion of a transmission line of which the conductive vias are a portion.

The circuit board of claim 11 provides improved conductive vias for a plurality of signal transmission lines and in particular a plurality of differential signal pairs. Different pairs of conductive vias experience reduced interaction and cross talk and improved impedance matching.

Arranging the conductive vias in a row further facilitates connection to a connector. Arranging the conductive vias in a plurality of rows facilitates arranging a large plurality of conductors and thus of transmission lines with predictable interaction in a restricted volume.

Parallel rows may be staggered and may be mutually separated by one or more adjustment portions.

In another aspect a circuit board according to claim 12 is provided. The circuit board provides improved impedance matching to connecting circuitry of the differential signal pairs formed by the second and third conductive vias and the fifth and sixth conductive pairs, respectively. Further, cross talk and insertion losses are reduced, in particular for high signal frequencies, e.g. higher than approximately 5 GHz and more so for signal frequencies higher than approximately 10 GHz. In another aspect a circuit board according to claim 13 is provided. The circuit board allows close packing of plural differential signal pairs, with reduced insertion losses for and reduced cross talk between the different differential signal pairs, improving signal transmission through the pairs, in particular at high signal frequencies of approximately 5 GHz and higher.

A connector comprising a circuit board as described above facilitates interconnection to further circuitry with reduced losses in signal quality. The circuit board itself may further comprise one or more circuits such as filters.

The invention will hereafter be more fully explained with reference to the drawings showing an embodiment of the invention by way of example.

BRIEF DESCRIPTION OF THE FIGURES

The foregoing summary, as well as the following detailed description of the application, will be better understood when read in conjunction with the appended drawings. In the drawings.

DETAILED DESCRIPTION OF EMBODIMENTS

It is noted that the drawings are schematic, not necessarily to scale and that details that are not required for understanding the present invention may have been omitted. The terms "upward", "downward", "below", "above", and the like relate to the embodiments as oriented in the drawings. Further, elements that are at least substantially identical or that perform an at least substantially identical function are denoted by the same numeral.

Figure 1:
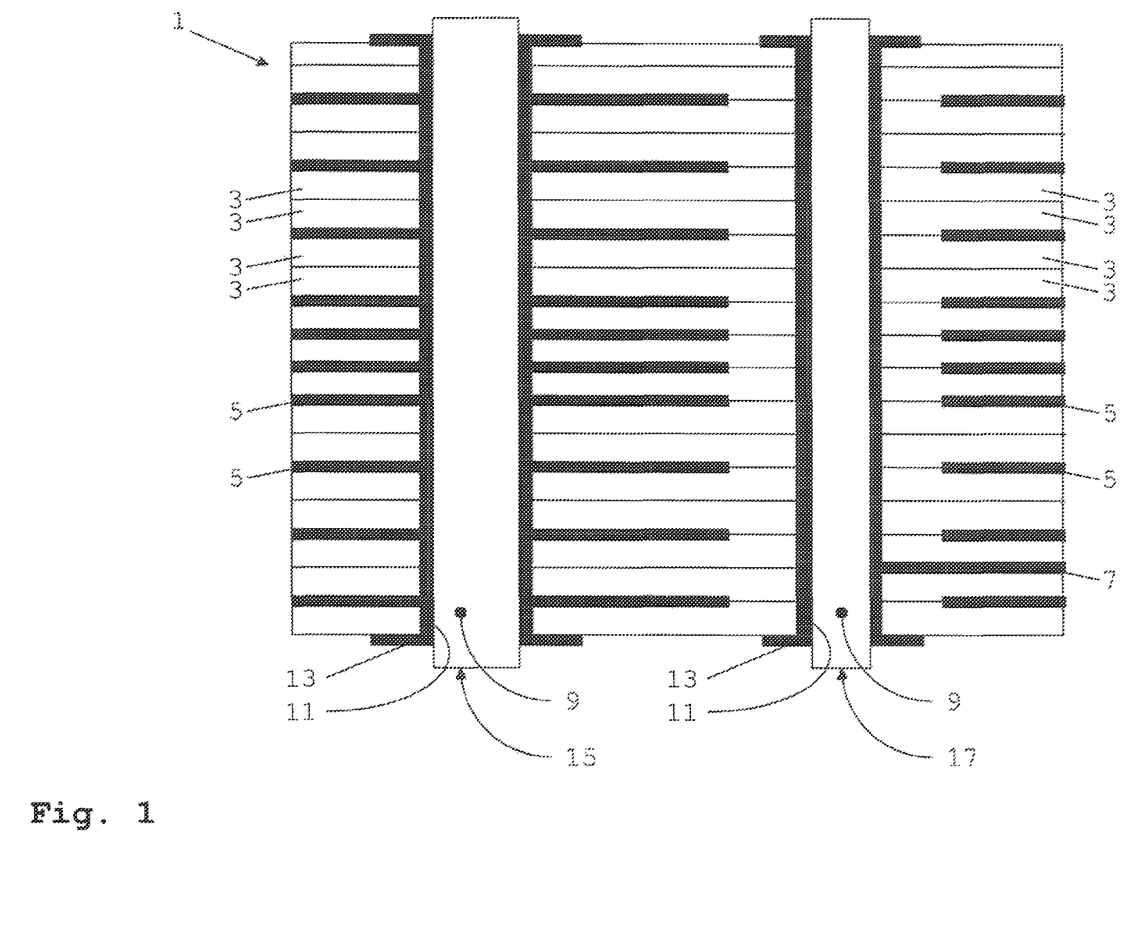
FIG. 1 shows a cross section of a portion of a prior art multi-layer circuit board.
Figure 2:
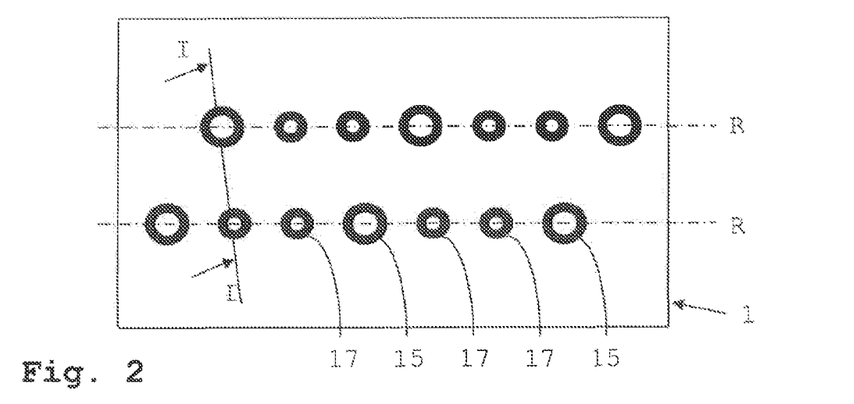
FIG. 2 shows a top view of the circuit board of FIG. 1.

FIG. 1 shows a cross section of a portion of a prior art multi-layer circuit board 1, shown in top view in FIG. 2. FIG. 2 is a top view of the circuit board 1 of FIG. 1, with the cross section of FIG. 1 indicated. The circuit board 1 comprises a plurality of insulating layers 3 separated by a plurality of ground layers 5 and a plurality of layers comprising signal traces 7 (only one signal trace 7 shown in FIG. 1). The insulating layers may be substantially identical or may differ from each other in one or more aspects, in particular size and/or one or more dielectric material properties. The circuit board 1 further comprises a plurality of through holes 9 (only two shown in FIG. 1) which penetrate through one or more of the insulating layers 3 of the board 1. The through hole 9 comprises a conductive plating layer 11 and optionally conductive plating flanges 13, or: pads, on outer surfaces of the board 1, together forming conductive vias 15 and 17. The conductive via 15 is connected to one or more ground layers 5 (here: all ground layers) and is termed a ground via 15. The conductive via 17 is insulated from the ground layers 5 and is connected to one or more signal traces 7 (here: one signal trace 7), the conductive via 17 is therefore also called a signal via 17. Adjacent vias 15, 17 are separated by portions of the circuit board 1 and insulated from each other by portions of the insulating layers 3.

As best visible in FIG. 2, in the circuit board 1 a plurality of conductive vias 15, 17 are arranged adjacent each other in rows R defining a direction of separation between the adjacent vias, which rows R, are optionally substantially parallel each other and which are optionally staggered with respect to each other as shown here. The conductive arrangement shown in FIG. 2 is that of a strip line geometry with conductors arranged as ground 15—signal 17—signal 17—ground 15—signal 17—signal 17—ground 15, which is very well suited for parallel transmission of differential signals through adjacent signal conductors (in the form of ground vias 15), shielded from each other and their environment by ground conductors (ground vias 15). However, the use may be different, i.e. not with differential signalling.

It will be apparent that in the shown circuit board 1 the ground vias 15 are somewhat larger than the signal vias 17. Further, in the direction of the row R, the mutual separation between each via 15, 17 is equal.

Alternatively, both types of vias 15, 17 may have equal sizes. Also, different sizes may exist between (groups of) ground vias 15 and/or signal vias 17. The vias may also be arranged equidistant with respect to an (imaginary) centre line, or be separated by varying distances.

Figure 3:
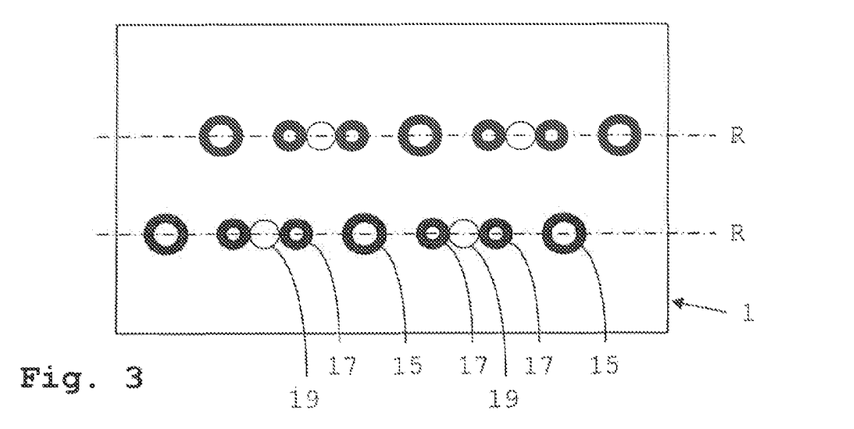
FIG. 3 shows a top view of a circuit board according to one embodiment.
Figure 4:
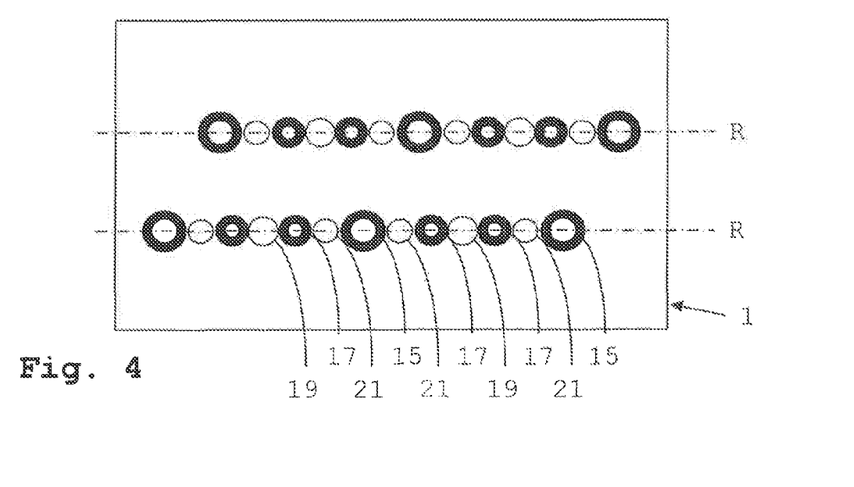
FIG. 4 shows a top view of a circuit board according to one embodiment.

FIGS. 3 and 4 show different embodiments of improved circuit boards 1 of a construction generally similar to the circuit board 1 of FIGS. 1 and 2.

However, different to the circuit board 1 of FIGS. 1 and 2, in the circuit board of FIG. 3, adjacent signal vias 17 are separated by adjustment portions 19 comprising a dielectric material property different from the first insulating layer. In between a signal via 17 and a ground via 15, there is no such adjustment portion.

In the circuit board of FIG. 4, all vias 15, 17 adjacent each other in a row R are separated by adjustment portions 19, 21. The adjustment portions 19 separate signal vias 17, and the adjustment portions 21 separate a signal via 17 and a ground via 15.

The adjustment portions 19, 21 may be of equal size. Here, however, the adjustment portions 19 between signal vias 17 are larger (here: have a larger diameter) than the adjustment portions 21 between a signal via 17 and a ground via 15. As set out above, the adjustment portions 19, 21 may comprise or be simply holes in the material of the circuit board 1 filled with the ambient atmosphere of the circuit board, e.g. air.

In another embodiment, a circuit board 1 may comprise a row R comprising along the row a signal via 17, an adjustment portion 19, a signal via 17, an adjustment portion 21 and a ground via 15, such as a single sided strip line arrangement of signal-signal-ground with adjustment portions in between. This is shown in cross section in FIG. 5 wherein the adjustment portions 19, 21 are formed as air gaps penetrating through the circuit board 1.

Simulations have been performed of propagation of a differential signal pulse sent through a pair of signal vias 17 of the circuit boards 1 of FIGS. 2-4 as well as of a similar circuit board comprising adjustment portions only between ground vias and signal vias, but not between adjacent signal vias (thus, such circuit board may be seen as the inverse of the circuit board of FIG. 3). In the simulation, all adjustment portions 19, 21 of the boards considered have been simulated as tubular air gaps of substantially circular outer shape. The simulations are for signal traces towards the bottom side of the circuit board 1 when the signal is supplied on the top side of the respective signal via 17, i.e. the signal has had to travel almost the entire length of the signal via 17 through the circuit board 1.

Figure 6:
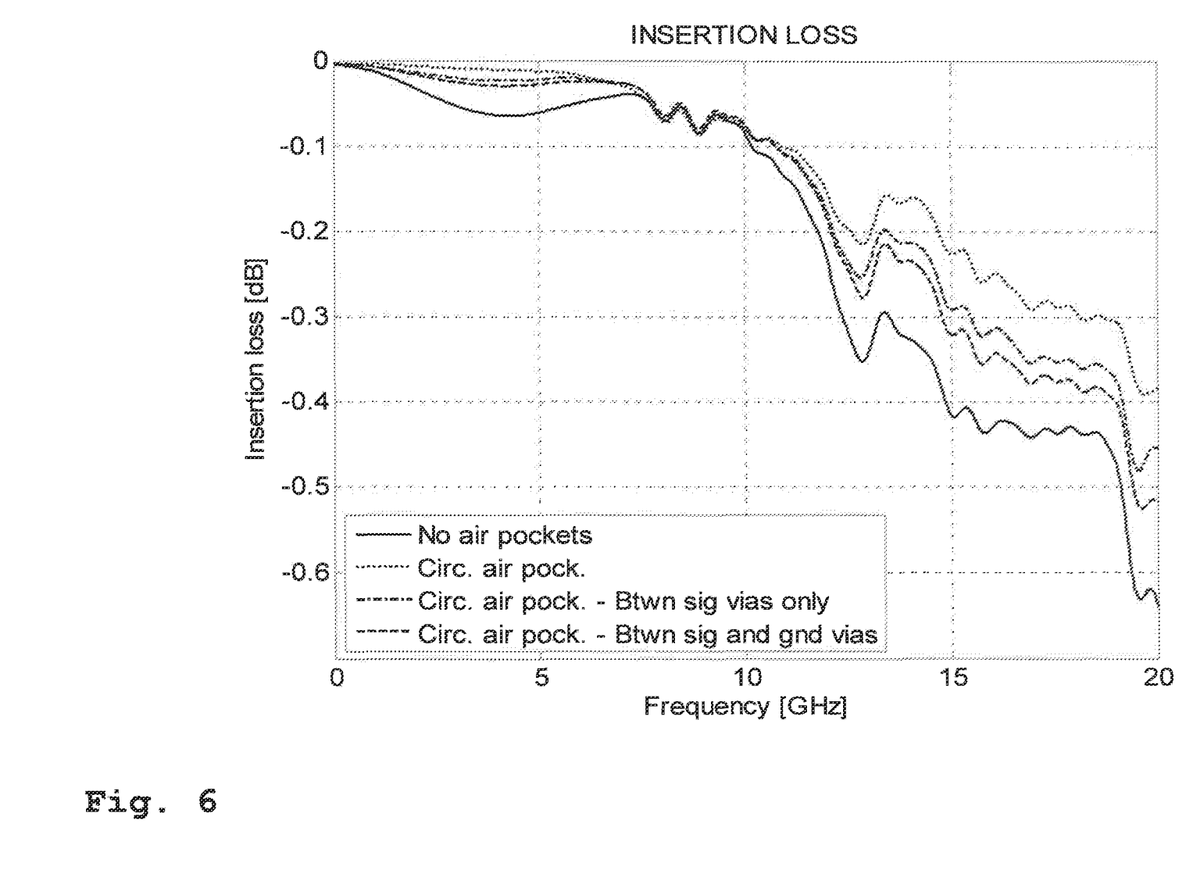
FIG. 6 shows results of a simulation of differential insertion loss for a pair of signal vias of the circuit boards of FIGS. 2-4.

FIG. 6 shows the results of a simulation of the differential insertion loss of a differential signal pulse. Here, the closer the curve is to 0 dB, the better.

Figure 7A:
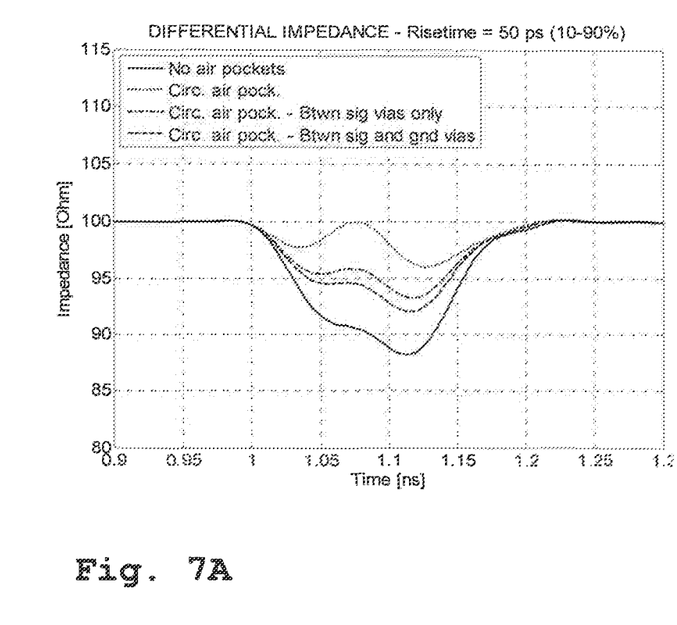
FIGS. 7A and 7B show results of simulations of differential impedance for a pair of signal vias of the circuit boards of FIGS. 2-4.
Figure 7B:
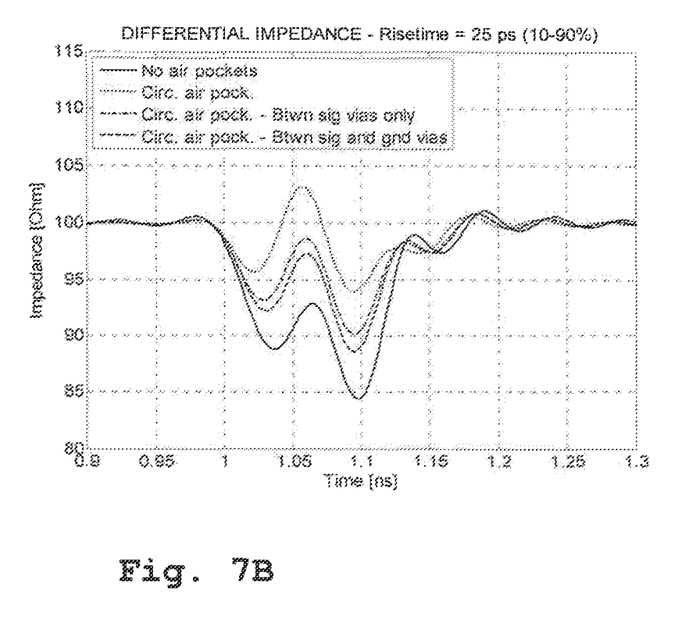

FIGS. 7A and 7B show the results of the simulations for differential impedance to signal traces 7 at 50 picoseconds, or: for a signal velocity of 10 GBits/second, and 25 picoseconds, or: for a signal velocity of 20 GBits/second, respectively. Here, the closer the curve is to 100 Ohm differential impedance, the better.

Figure 8:
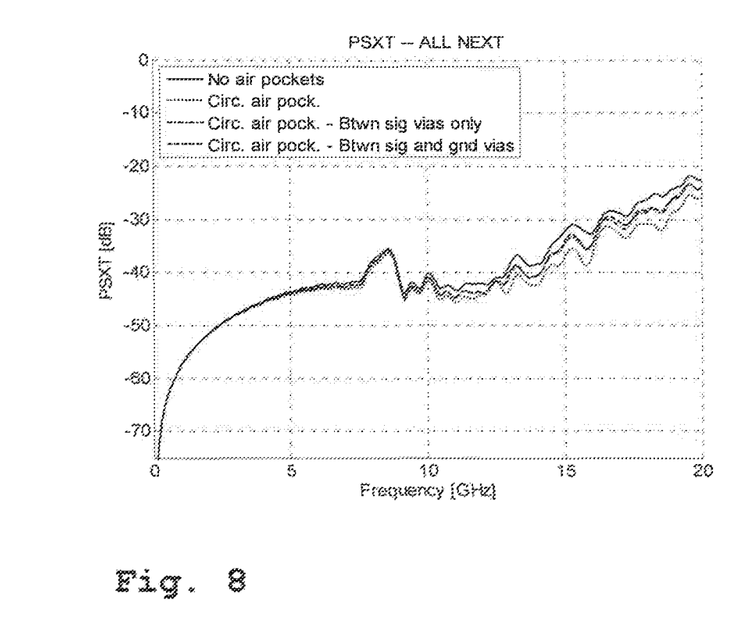
FIG. 8 shows results of a simulation of near end cross talk between a pair of differential signal vias of the circuit boards of FIGS. 2-4.
Figure 9:
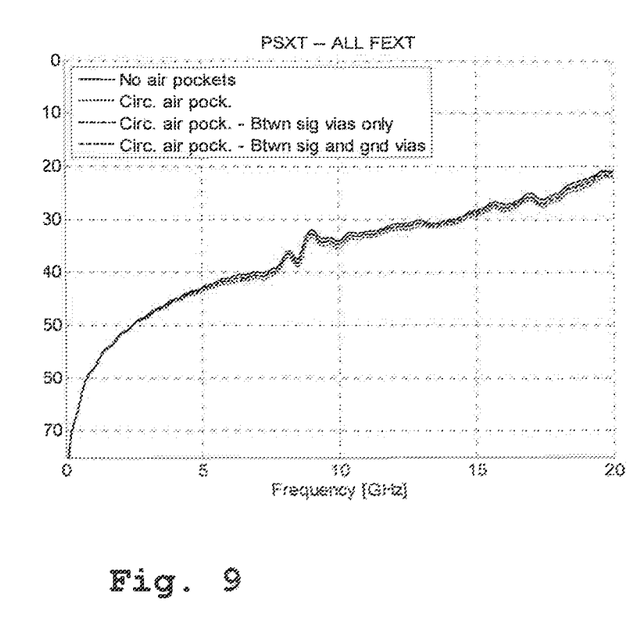
FIG. 9 shows results of a simulation of far end cross talk between a pair of differential signal vias of the circuit boards of FIGS. 2-4.

FIG. 8 shows the result for near end cross talk between the pair and FIG. 9 shows the result for far end cross talk between the pair. Here, the lower the curve is, the better.

In FIGS. 6-9, a drawn line represents the results of FIG. 2 ("no air pockets"), dash-dotted line the results of FIG. 3 (". . . Btwn sig vias only"), a dotted line the results of FIG. 4 ("Circ. air pock."=circular air gaps, between all vias), a and a dashed line the results of circuit board with adjustment portions only between ground vias and signal vias, but not between adjacent signal vias (". . . Btwn sig and gnd vias").

From FIGS. 6-9 it will be apparent that at substantially all signal frequencies 0-20 GHz, the provision of adjustment portions has a beneficial effect on all simulated aspects. In a frequency region between approx. 8-10 GHz there is little difference in the insertion loss between the different circuit board arrangements (FIG. 6). The effects for differential pair cross talk become increasingly noticeable at increasing frequencies, in particular at frequencies of approx. 10 GHz and higher (FIGS. 8, 9).

Figure 10:
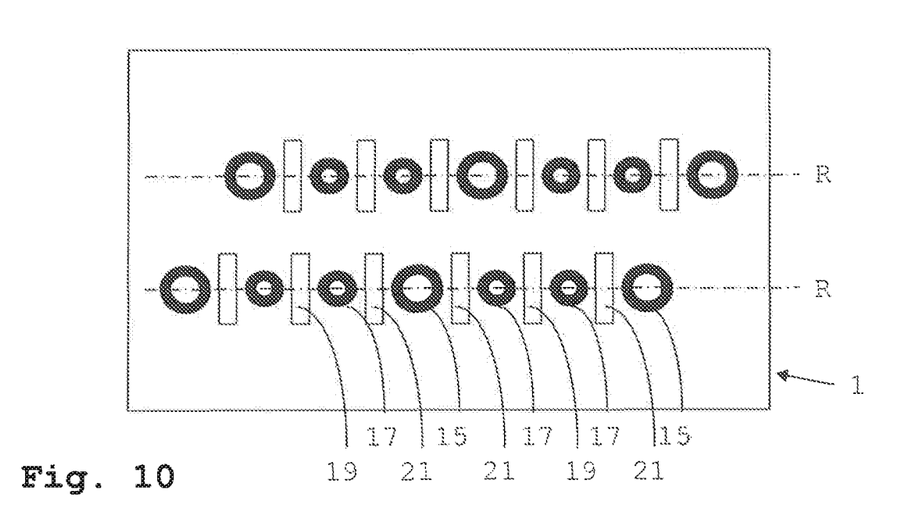
FIG. 10 shows a top view of a circuit board according to one embodiment.

FIG. 10 shows another embodiment of an improved circuit board 1, similar to the circuit board 1 of FIG. 4. In this circuit board 1, the adjustment portions 19 and 21 are formed as substantially rectangular slots, extending substantially perpendicular to the direction of each row R along which the vias 15, 17 are arranged.

FIGS. 11-14 show the results of simulations just as for FIGS. 6-9. For FIGS. 11-14, in each case the adjustment portions have been taken as rectangular air gaps, instead of circular air gaps. Here, the dimensions of the adjustment portions are chosen with a width in the direction of the row R of approx one half times the separation between the vias 15, 17 and having a length perpendicular to the direction of the row R of approx. twice the diameter of the vias.

From a comparison between FIGS. 6-9 and 11-14, it will be apparent that also in this case the provision of adjustment portions 19, 21 is beneficial to the behaviour of signal pulses through the circuit board 1.

Figure 11:
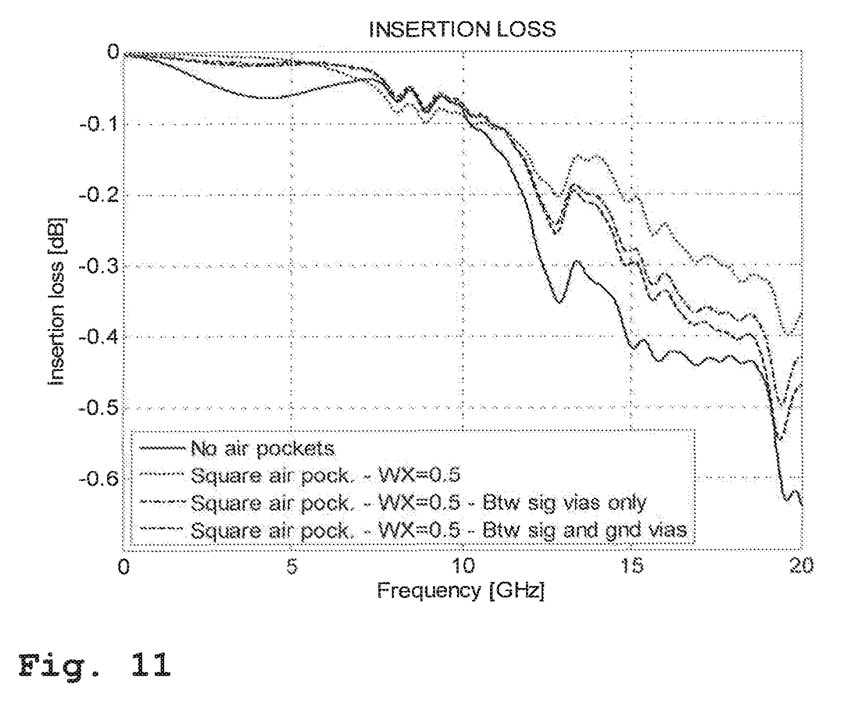
FIG. 11 shows results of a simulation of differential insertion loss for a pair of signal vias of the circuit board of FIG. 10.
Figure 12A:
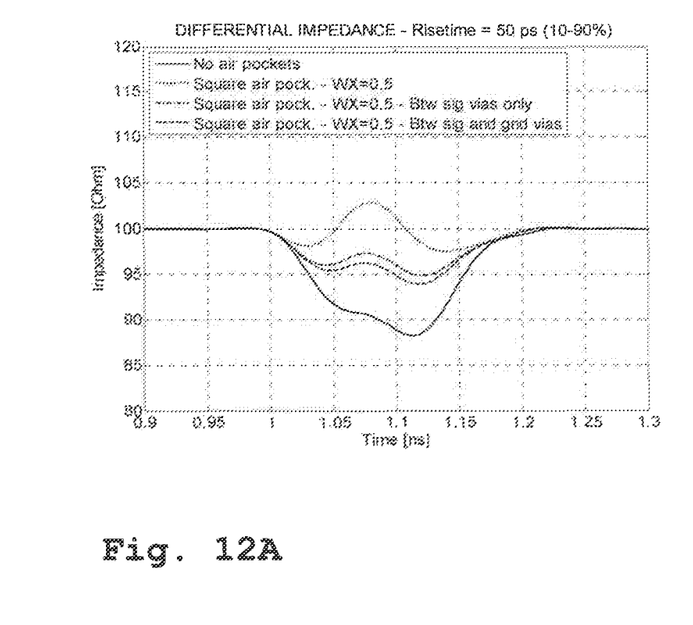
FIGS. 12A and 12B show results of simulations of differential impedance for a pair of signal vias of the circuit board of FIG. 10.
Figure 12B:
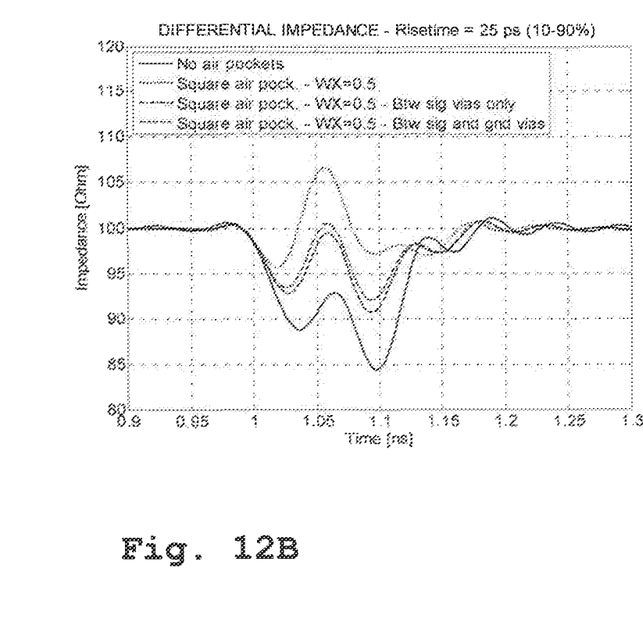
Figure 13:
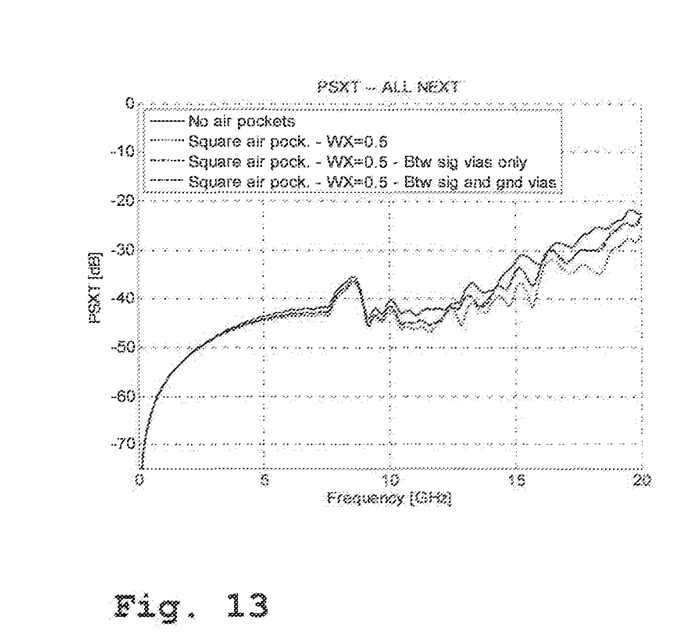
FIG. 13 shows results of a simulation of near end cross talk between a pair of differential signal vias of the circuit boards of FIG. 10.
Figure 14:
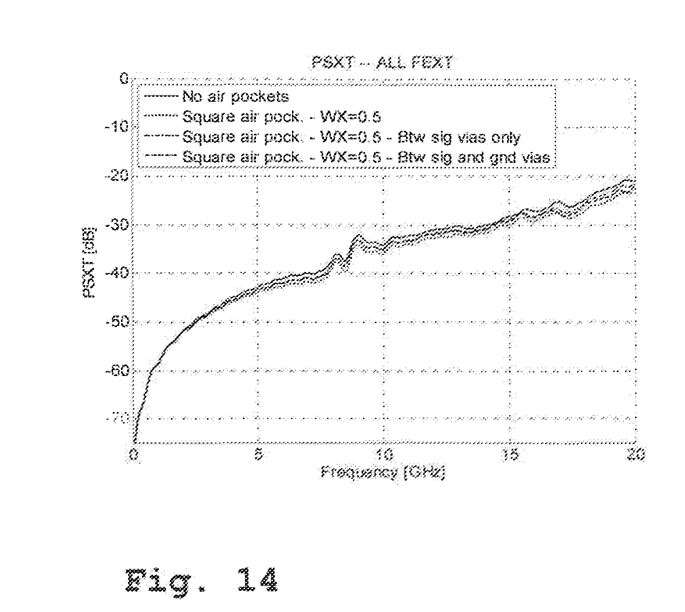
FIG. 14 shows results of a simulation of far end cross talk between a pair of differential signal vias of the circuit boards of FIG. 10.

In fact, in FIG. 11 it is visible that for a frequency range of approx. 6-11 GHz, insertion loss may be reduced by not having adjustment portions between all vias. For such frequencies, also the differential impedance shows less variation (FIG. 12A). However, it is again found that providing adjustment portions between all vias reduces the cross talk for all frequencies (FIGS. 13 and 14). Thus, depending on the prospective use, e.g. the intended signal frequency to be transmitted through the vias and whether or not using differential signalling, one may select to use more or less adjustment portions.

An adjustment portion in the form of an air gap may be wholly or partially plugged by insertion of a dielectric object into the air gap to obtain a desired behaviour.

Figure 5:
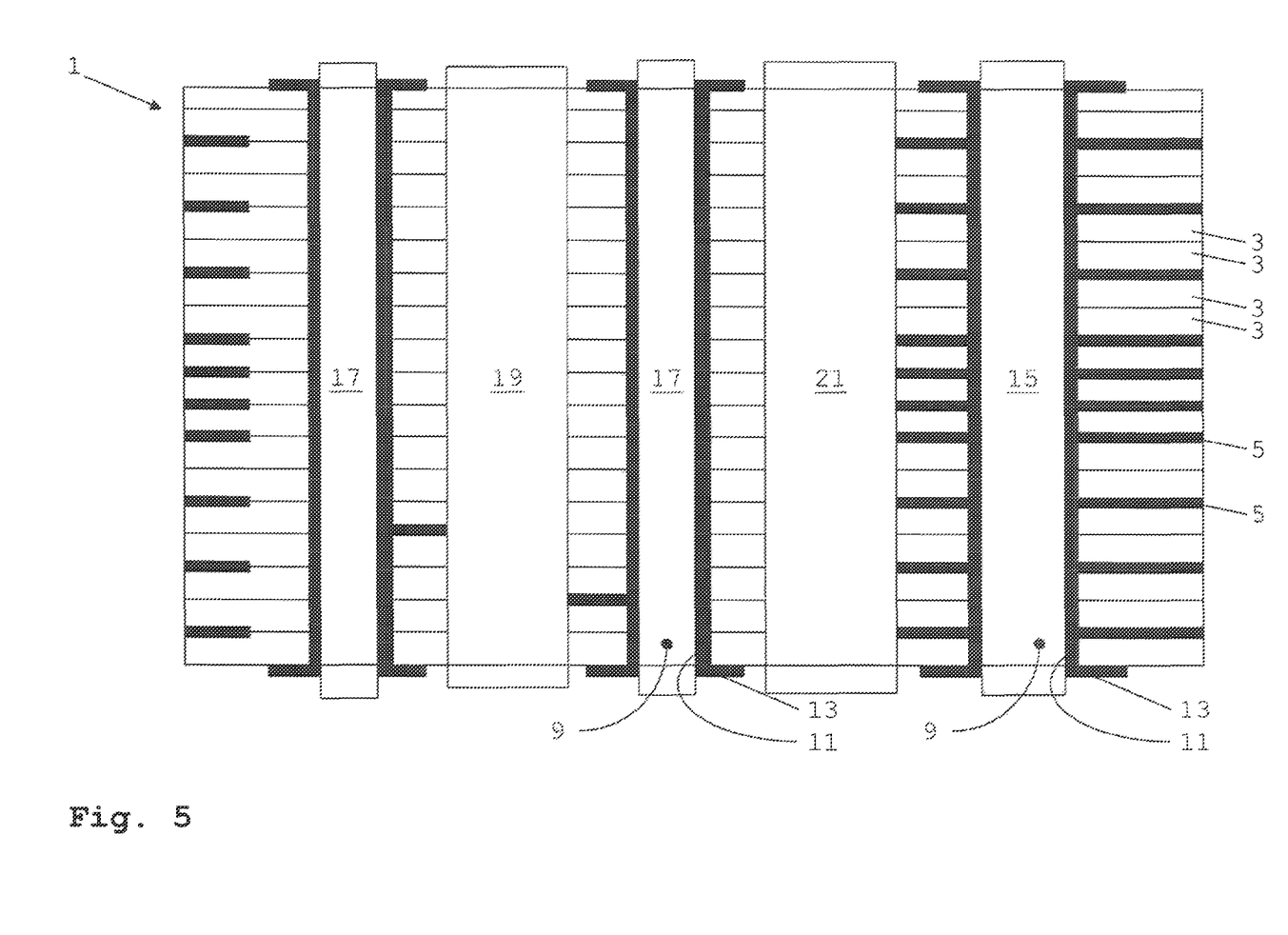
FIG. 5 shows a cross section of a portion of a circuit board according to one embodiment.
Figure 15:
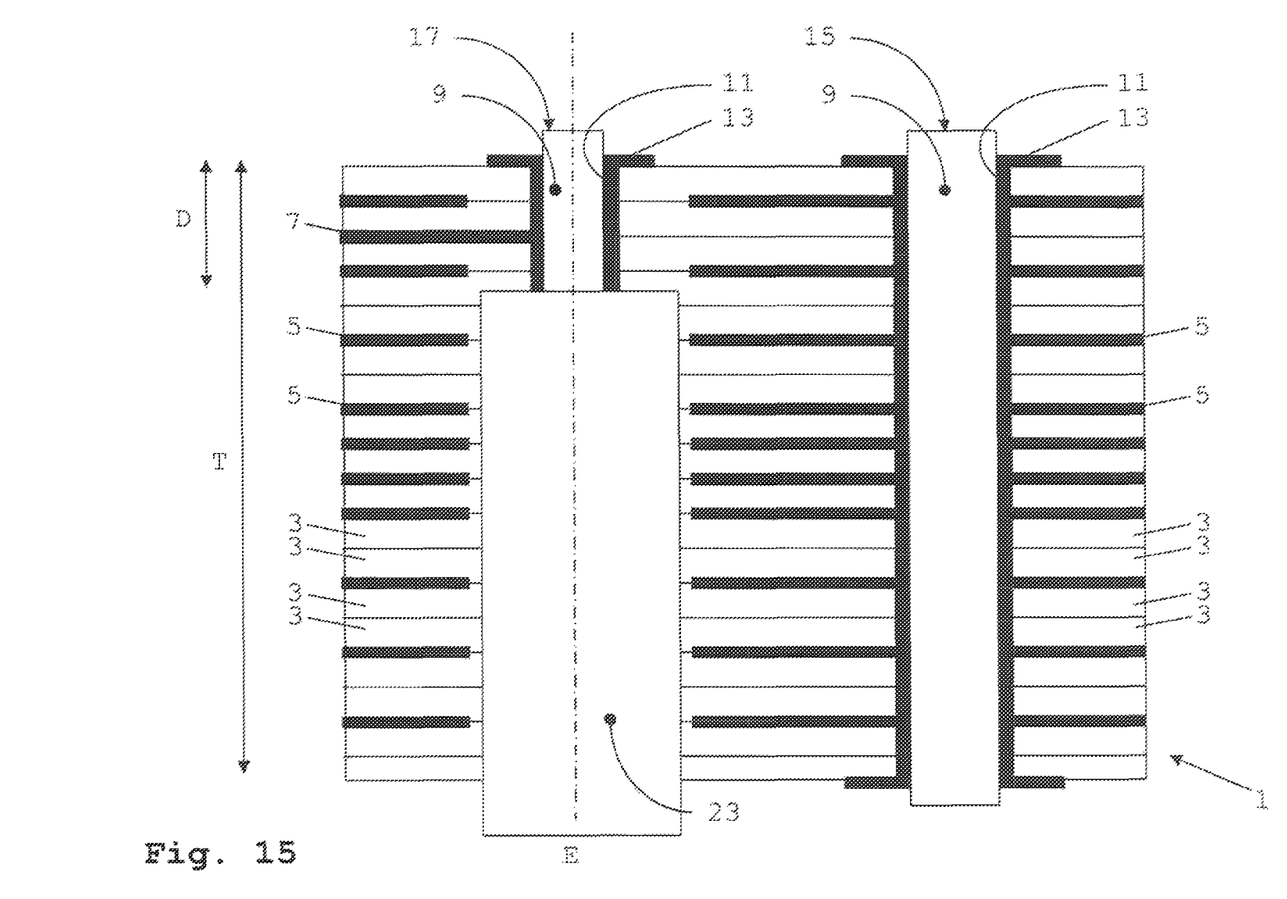
FIG. 15 shows a cross section view of a circuit board according to one embodiment.

FIG. 15 shows, in cross section view similar to FIGS. 1 and 5, a variation of a circuit board 1. The circuit board 1 has a thickness T, and comprises a conductive signal via 17, which is connected to a signal trace 7 that is arranged relatively close to the top of the circuit board 1. A portion of the plating layer 11 and the flange 13 on the bottom side of the conductive via 17 are absent, compared to the vias 15, 17 discussed before, so that a via is formed which is conductive over only a fraction of its length. The via 17 has a conductive portion (here in the form of the plating 11) which extends through the circuit board 1 along a direction of extension E for a distance D which is less than the thickness T of the circuit board 1. Along the direction of extension E, or: instead of the absent portion of the via 17, an adjustment portion 23 is arranged comprising one or more dielectric material properties different from those of one or more insulating layers 3. As a consequence, any antenna-effect is prevented of a portion of the via 17 extending towards the bottom side of the circuit board 1 significantly further than the position on which the conducting portion 11 of the via 17 connects with a trace 7. The circuit board 1 may comprise plural partially conductive vias 15, 17, of which the lengths of the conductive portions may be equal or different depending on the level on or within the circuit board that via is connected to one or more conductive traces or layers. Such structure of a via of which a conducting portion extends only partly into the circuit board may also be employed for one or more ground vias 15.

In the circuit board 1 shown in FIG. 5, adjacent the signal via 17 a ground via 15 is formed just as in the embodiments shown above. Between adjacent signal vias 17 and signal and ground vias 15, 17 one or more adjustment portions 19, 21 may be provided as described before (not shown).

Such circuit board 1 of FIG. 15 may be manufactured easily by forming a circuit board comprising a desired number of vias, arranging a plating layer 11 and flanges 13 in regular fashion in all vias. In this way, a method of manufacturing of the board as a whole need not be altered. In an optional subsequent step the plating layer 11 and the flange 13 are then removed from the circuit board 1 in the desired amount at the selected vias 15, 17. Such removal may e.g. be done by drilling a recess along the selected plated through via 15, 17 with an appropriate tool, e.g. a drill bit having a larger size (diameter) than (the plating of) the via. The recess may be left empty or be partly or wholly filled with a dielectric material to form an adjustment portion 23 with one or more desired properties.

Figure 16:
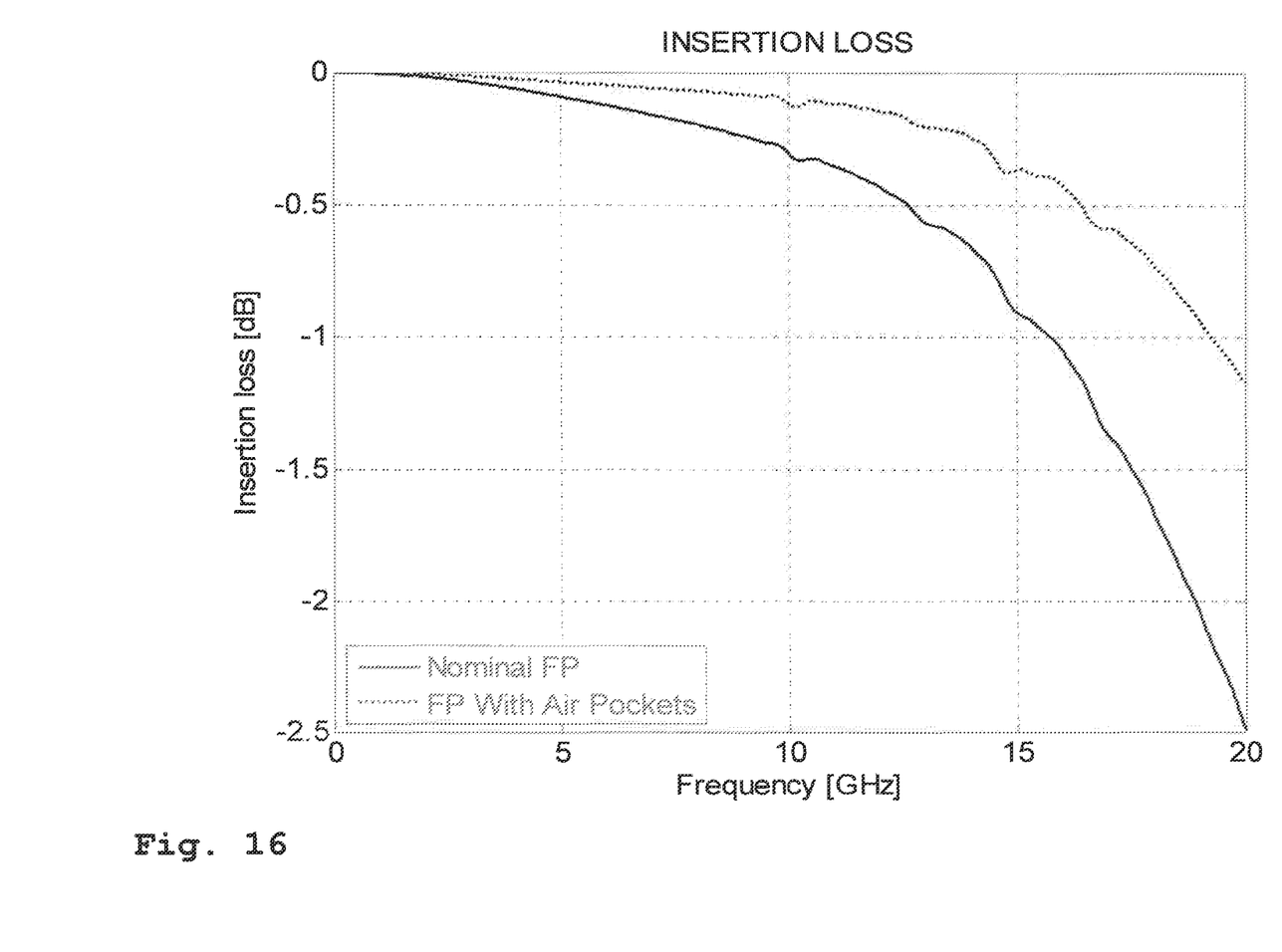
FIG. 16 shows results of a simulation of differential insertion loss for a pair of signal vias of the circuit board of FIG. 15.
Figure 17A:
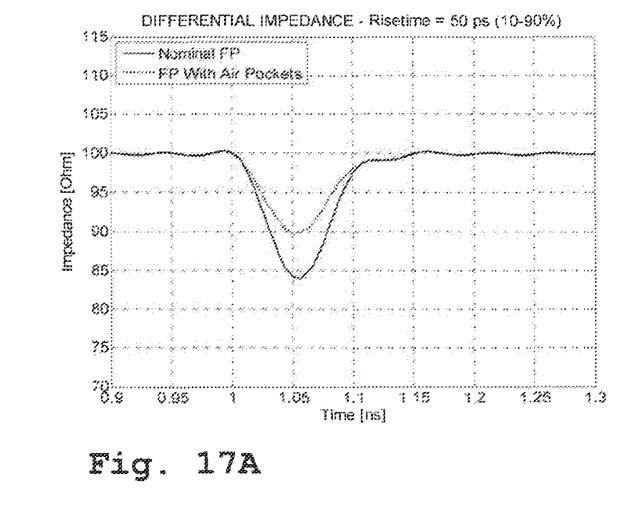
FIGS. 17A and 17B show results of simulations of differential impedance for a pair of signal vias of the circuit board of FIG. 15.
Figure 17B:
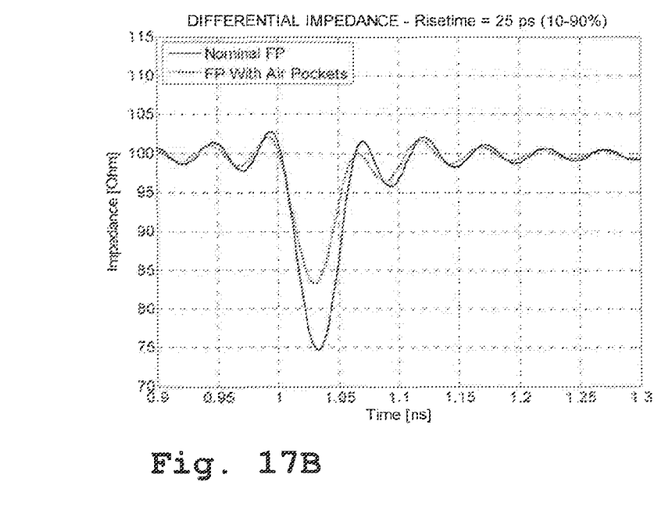

FIGS. 16-17B show the results of simulations, as before, for a circuit board 1 comprising a row R of vias 15, 17 which are mutually separated with rectangular air gaps 19, 21 as in FIG. 10, wherein the signal vias 17 are partially conductive and the ground vias 15 are fully conductive as in FIG. 15 (dotted line, "FP with air pockets"). For comparison the results of a circuit board 1 of FIG. 2 are also shown in the FIGS. 16-17B (drawn line, "Nominal FP").

It will be apparent from a comparison with the other simulation results that the improved circuit board 1 provides significantly less differential insertion loss (FIG. 16) at substantially all frequencies and a significantly improved differential impedance at signal frequencies of 10 GHz (FIG. 17A) and 20 GHz (FIG. 17B).

Figure 18:
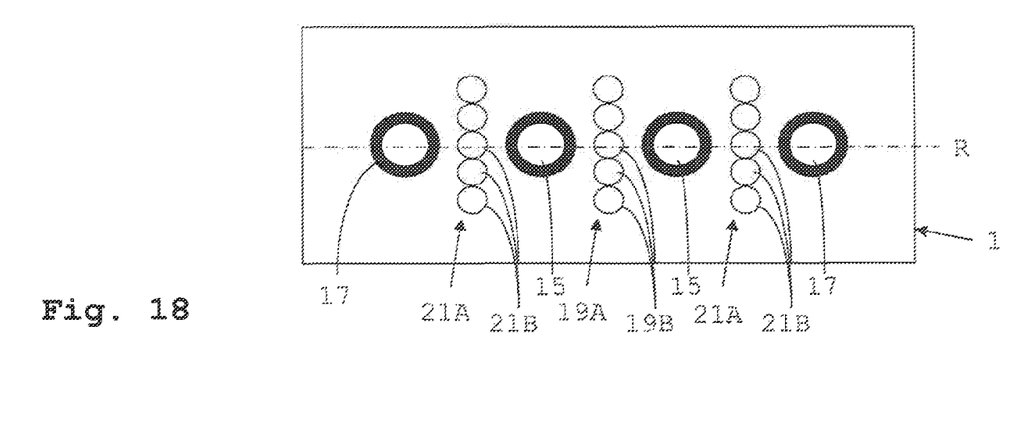
FIG. 18 shows a top view of a circuit board according to one embodiment.

FIG. 18 is a top view of an alternative embodiment of a circuit board 1 showing that compound adjustment portions 19A, 21A separating vias 15, 17 may be formed from a plurality of subsidiary adjustment portions 19B, 21B arranged close together. In the shown embodiment, substantially rectangular compound adjustment portions 19A, 21A are formed by series of adjacent substantially circular subsidiary adjustment portions 19B, 21B. The subsidiary adjustment portions 19B, 21B may be substantially identical or different. Other arrangements of more or less subsidiary adjustment portions 19B, 21B are also conceivable.

The invention is not restricted to the above described embodiments which can be varied in a number of ways within the scope of the claims. For instance a circuit board may comprise more or less conducting vias.

Conducting vias and adjustment portions need not be arranged in straight rows, nor symmetrically with respect to a straight or bent row. Adjacent rows need not be parallel.

In between parallel rows R of conducting vias in FIGS. 2-4 and 10 spaces are arranged, which may be used for routing traces. Rows R may be separated by one or more adjustment portions.

In a circuit board, conducting vias may be separated by several adjustment portions adjacent each other in the direction of separation of the vias. Thus, a larger compound adjustment portion may be formed.

Adjustment portions may be formed by drilling an array of holes or recesses into the circuit board and selectively plating the vias such that one or more adjacent conducting vias are separated by unplated vias.

A conducting via may be connected to plural traces on one or more layers of the circuit board. A ground layer may be conducting across large portions of its area or comprise a number of ground traces.

Elements and aspects discussed for or in relation with a particular embodiment may be suitably combined with elements and aspects of other embodiments, unless explicitly stated otherwise.

The invention claimed is:
1. A circuit board comprising:
a plurality of insulating layers including a first insulating layer;
at least one ground layer;
at least one signal layer including a plurality of signal traces; and
at least a first conductive via and a second conductive via, wherein:
each of the first conductive via and the second conductive via penetrate through at least a first insulating layer of the plurality of insulating layers and is connected to a signal trace of the at least one signal layer;
the first conductive via and the second conductive via are arranged adjacent each other; and
at least in the first insulating layer, the first conductive via and the second conductive via are separated in a first direction of separation by a first adjustment portion defined by an unplated via, the first adjustment portion comprising a dielectric material property different from the first insulating layer.

2. The circuit board of claim 1, wherein the first conductive via and second conductive via are configured as a differential signal pair.

3. The circuit board of claim 1, comprising a third conductive via adjacent the second conductive via opposite the first conductive via, penetrating through at least the first insulating layer and connected to at least one of a ground trace and a ground layer,
wherein the second conductive via and the third conductive via are separated in a second direction of separation by a second adjustment portion comprising a dielectric material property different from the first insulating layer.

4. The circuit board of claim 1, comprising a third conductive via adjacent the second conductive via and a fourth conductive via adjacent the first conductive via, the third conductive via and the fourth conductive via penetrating through at least the first insulating layer and being connected to at least one of a ground trace and a ground layer, wherein the first to fourth conductive vias are arranged mutually adjacent in a row as ground-signal-signal-ground.

5. The circuit board of claim 4, wherein the second conductive via and the third conductive via are separated in the direction of the row by a second adjustment portion comprising a dielectric material property different from the first insulating layer, and
wherein the fourth conductive via and the first conductive via are separated in the direction of the row by a third adjustment portion comprising a dielectric material property different from the first insulating layer.

6. The circuit board of claim 1, comprising a third conductive via arranged adjacent the second conductive via opposite the first conductive via and fourth, fifth, sixth and seventh conductive vias arranged adjacent the first conductive via opposite the third conductive via,
wherein the first, second, fifth and sixth conductive vias penetrate through at least the first insulating layer and are connected to a signal trace, and the third, fourth and seventh conductive vias penetrate through at least the first insulating layer and are connected to at least one of a ground trace and a ground layer, such that the first to seventh conductive vias are arranged mutually adjacent in a row as ground-signal-signal-ground-signal-signal-ground,
wherein at least the fifth and sixth conductive vias penetrate through at least one of the first insulating layer and a second insulating layer of the at least one insulating layer,
wherein in at least one of the first and second insulating layers the fifth conductive via and the sixth conductive via are separated in the direction of the row by a further adjustment portion of insulating material comprising a dielectric material property different from at least one of the first and second insulating layers.

7. The circuit board of claim 6, wherein all adjacent first to seventh conductive vias are mutually pairwise separated in the direction of the row by adjustment portions comprising a dielectric material property different from at least one insulating penetrated by the respective pair of mutually adjacent conductive vias.

8. The circuit board of claim 7, comprising a plurality of rows of adjacent conductive vias penetrating at least the first insulating layer, wherein the adjacent conductive vias within each row are mutually pairwise separated in the direction of each row by adjustment portions comprising a dielectric material property different from at least the first insulating layer, the plurality of rows including the row and a second row of adjacent conductive vias.

9. The circuit board of claim 6, wherein all adjacent first to seventh conductive vias are mutually pairwise separated in the direction of the row by adjustment portions comprising a dielectric material property different from each insulating layer penetrated by the respective pair of mutually adjacent conductive vias.

10. The circuit board of claim 1, wherein at least a portion of at least one of the adjustment portion(s) is formed as an air-gap.

11. The circuit board of claim 1, wherein two adjacent conductive vias are mutually separated by a separation distance along a respective direction of separation wherein at least one of the adjustment portion(s) separating the two adjacent conductive vias in the respective direction of separation is formed to extend between the two adjacent conductive vias in that respective direction of separation for a length of more than approximately one quarter of the separation distance between the two adjacent conductive vas.

12. The circuit board of claim 1, wherein two adjacent conductive vias are mutually separated by a separation distance along a respective direction of separation wherein at least one of the adjustment portion(s) separating the two adjacent conductive vias in the respective direction of separation is formed to extend between the two adjacent conductive vias in a direction substantially perpendicular to that respective direction of separation for a length of more than approximately one times the size of at least one of the two adjacent conductive vias in a direction substantially perpendicular to that respective direction of separation.

13. A connector comprising the circuit board of claim 1.

14. The circuit board of claim 1, wherein two adjacent conductive vias are mutually separated by a separation distance along a respective direction of separation wherein at least one of the adjustment portion(s) separating the two adjacent conductive vias in the respective direction of separation is formed to extend between the two adjacent conductive vias in that respective direction of separation for a length of more than approximately one half of the separation distance between the two adjacent conductive vias.

15. The circuit board of claim 1, wherein two adjacent conductive vias are mutually separated by a separation distance along a respective direction of separation wherein at least one of the adjustment portion(s) separating the two adjacent conductive vias in the respective direction of separation is formed to extend between the two adjacent conductive vias in that respective direction of separation for a length of more than approximately three quarters of the separation distance between the two adjacent conductive vias.

16. The circuit board of claim 1, wherein two adjacent conductive vias are mutually separated by a separation distance along a respective direction of separation wherein at least one of the adjustment portion(s) separating the two adjacent conductive vias in the respective direction of separation is formed to extend between the two adjacent conductive vias in a direction substantially perpendicular to that respective direction of separation for a length of more than approximately one and a half times the size of at least one of the two adjacent conductive vias in a direction substantially perpendicular to that respective direction of separation.

17. The circuit board of claim 1, wherein two adjacent conductive vias are mutually separated by a separation distance along a respective direction of separation wherein at least one of the adjustment portion(s) separating the two adjacent conductive vias in the respective direction of separation is formed to extend between the two adjacent conductive vias in a direction substantially perpendicular to that respective direction of separation for a length of more than approximately two times the size of at least one of the two adjacent conductive vias in a direction substantially perpendicular to that respective direction of separation.

18. A circuit board comprising:
   a plurality of insulating layers including a first insulating layer;
   at least one ground layer;
   at least one signal layer including a plurality of signal traces; and
   at least seven conductive vias arranged mutually adjacent in a row, wherein:
      each of the first, fourth and seventh conductive vias, as counted along the row, penetrates through at least the first insulating layer and is connected to at least one of a ground trace and a ground layer, and wherein each of the second, third, fifth and sixth conductive vias, as counted along the row, penetrates through at least the first insulating layer and is connected to a signal trace of the at least one signal layer, such that the first to seventh conductive vias are arranged as ground-signal-signal-ground-signal-signal-ground,
      the second and third conductive vias, as counted along the row, are configured as a first differential signal pair and the fifth and sixth conductive vias, as counted along the row, are configured as a second differential signal pair; and
      the adjacent first to seventh conductive vias are mutually pairwise separated in the direction of the row by adjustment portions comprising air gaps so as to provide a dielectric material property different from at least the first insulating layer.

19. The circuit board of claim 18, wherein at least one of the adjustment portions is defined by an unplated via.

20. A circuit board comprising:
   a plurality of insulating layers including a first insulating layer;
   at least one ground layer;
   at least one signal layer including a plurality of signal traces; and
   a plurality of mutually parallel adjacent rows, each row including at least seven conductive vias arranged mutually adjacent in the row, wherein in each row:
      each of the first, fourth and seventh conductive vias, as counted along the row, penetrates through at least the first insulating layer and is connected to at least one of a ground trace and a ground layer;
      each of the second, third, fifth and sixth conductive vias, as counted along the row, penetrates through at least the first insulating layer and is connected to a signal trace, such that the first to seventh conductive vias are arranged as ground-signal-signal-ground-signal-signal-ground, with the second and third conductive vias being configured as a first differential pair and the fifth and sixth conductive vias being configured as a second differential signal pair; and
      the adjacent first to seventh conductive vias are mutually pairwise separated in the direction of the row by adjustment portions comprising air gaps so as to provide a dielectric material property different from at least the first insulating layer.

21. The circuit board of claim 20, wherein at least one of the adjustment portions is defined by an unplated via.

\* \* \* \* \*

UNITED STATES PATENT AND TRADEMARK OFFICE
CERTIFICATE OF CORRECTION

Page 1 of 1

PATENT NO. : 9,084,353 B2
APPLICATION NO. : 13/807325
DATED : July 14, 2015
INVENTOR(S) : Jan De Geest et al.

It is certified that error appears in the above-identified patent and that said Letters Patent is hereby corrected as shown below:

In the Claims

COL. 10, line 29 (Claim 11), delete "vas" and substitute therefor --vias--

Signed and Sealed this
Seventeenth Day of November, 2015

Michelle K. Lee
*Director of the United States Patent and Trademark Office*